US010059133B2

(12) United States Patent
Chiba et al.

(10) Patent No.: US 10,059,133 B2
(45) Date of Patent: Aug. 28, 2018

(54) PRINTER AND METHOD OF DETECTING NEAR-END STATE OF RECORDING PAPER IN PRINTER

(71) Applicant: FUJITSU COMPONENT LIMITED, Tokyo (JP)

(72) Inventors: Masafumi Chiba, Tokyo (JP); Sumio Watanabe, Tokyo (JP); Yoshinari Takabatake, Tokyo (JP)

(73) Assignee: FUJITSU COMPONENTS LIMITED, Tokyo (JP)

( * ) Notice: Subject to any disclaimer, the term of this patent is extended or adjusted under 35 U.S.C. 154(b) by 0 days.

(21) Appl. No.: 15/500,166

(22) PCT Filed: Jul. 31, 2015

(86) PCT No.: PCT/JP2015/071861

§ 371 (c)(1),
(2) Date: Jan. 30, 2017

(87) PCT Pub. No.: WO2016/021514

PCT Pub. Date: Feb. 11, 2016

(65) Prior Publication Data

US 2017/0259594 A1 Sep. 14, 2017

(30) Foreign Application Priority Data

Aug. 6, 2014 (JP) ................................ 2014-160774
Sep. 1, 2014 (JP) ................................ 2014-177316

(51) Int. Cl.
*B41J 11/00* (2006.01)
*B41J 15/04* (2006.01)
(Continued)

(52) U.S. Cl.
CPC ......... *B41J 15/044* (2013.01); *B41J 11/0075* (2013.01); *B41J 13/0009* (2013.01);
(Continued)

(58) Field of Classification Search
CPC ...... B41J 2/32; B41J 11/0075; B41J 13/0009; B41J 15/042; B41J 15/044; B41J 29/02;
(Continued)

(56) References Cited

U.S. PATENT DOCUMENTS 5,820,068 A * 10/1998 Hosomi ................ B26D 1/305 242/563
5,884,861 A * 3/1999 Hosomi ................ B26D 1/305 242/563

(Continued)

FOREIGN PATENT DOCUMENTS

JP H08-034554 2/1996
JP 2005-001381 1/2005

(Continued)

*Primary Examiner* — Ahn T. N. Vo
(74) *Attorney, Agent, or Firm* — IPUSA, PLLC

(57) ABSTRACT

A printer includes a printer body and a lid. The printer body includes a recording paper holder configured to accommodate a roll of recording paper and a projection provided on a bottom surface of the recording paper holder that contacts the recording paper. The lid is attached to the printer body to be opened and closed relative to the printer body.

11 Claims, 26 Drawing Sheets

(51) Int. Cl.
*B41J 29/48* (2006.01)
*B41J 13/00* (2006.01)
*B41J 29/02* (2006.01)
*B65H 26/08* (2006.01)
*B65H 16/02* (2006.01)

(52) U.S. Cl.
CPC ............. *B41J 15/042* (2013.01); *B41J 29/02* (2013.01); *B41J 29/48* (2013.01); *B65H 26/08* (2013.01); *B65H 16/028* (2013.01); *B65H 2301/41386* (2013.01); *B65H 2801/12* (2013.01); *H05K 999/99* (2013.01)

(58) Field of Classification Search
CPC ........ B65H 16/028; B65H 26/08; B65H 5/08; B65H 2553/61; B65H 2553/80; B65H 2553/81; B65H 2553/82; B65H 2553/822
See application file for complete search history.

(56) References Cited

U.S. PATENT DOCUMENTS

| | | | | |
|---|---|---|---|---|
| 7,018,119 | B2 | 3/2006 | Koyabu | |
| 7,802,750 | B2 * | 9/2010 | Takeuchi | B41J 15/042 242/423 |
| 7,975,955 | B2 * | 7/2011 | Takeuchi | B41J 2/32 242/564.1 |
| 8,459,888 | B2 * | 6/2013 | Shirotori | B26D 1/085 400/621 |
| 8,616,793 | B2 * | 12/2013 | Kasugai | B41J 3/4075 400/613 |
| 8,627,754 | B2 * | 1/2014 | Kasugai | B26D 1/085 400/621 |
| 8,974,052 | B2 * | 3/2015 | Tanaka | B41J 3/36 347/108 |
| 2008/0095564 | A1 | 4/2008 | Yada et al. | |
| 2009/0028624 | A1 * | 1/2009 | Kobayashi | B41J 3/4075 400/615.2 |
| 2012/0224904 | A1 | 9/2012 | Nihashi et al. | |
| 2012/0224905 | A1 | 9/2012 | Nihashi | |

FOREIGN PATENT DOCUMENTS

| | | |
|---|---|---|
| JP | 2008-179449 | 8/2008 |
| JP | 2009-096595 | 5/2009 |
| JP | 2012-184056 | 9/2012 |
| JP | 2013-099856 | 5/2013 |

* cited by examiner

FIG.27

| FIRST RECORDING PAPER SENSOR | SECOND RECORDING PAPER SENSOR | THIRD RECORDING PAPER SENSOR | |
|---|---|---|---|
| 0 | 0 | 0 | NO RECORDING PAPER |
| 1 | 0 | 0 | RECORDING PAPER RADIUS r7 (NEAR END) |
| 0 | 1 | 0 | RECORDING PAPER RADIUS r4, r5 (MIDDLE RADIUS) |
| 0 | 0 | 1 | RECORDING PAPER ROLLING |
| 1 | 1 | 0 | RECORDING PAPER RADIUS r6 (NEAR END) |
| 1 | 0 | 1 | INVALID |
| 0 | 1 | 1 | RECORDING PAPER RADIUS r1−r3 (LARGE RADIUS) |
| 1 | 1 | 1 | INVALID |

PRINTER AND METHOD OF DETECTING NEAR-END STATE OF RECORDING PAPER IN PRINTER

TECHNICAL FIELD

The present invention relates to printers and methods of detecting the near-end state of recording paper in a printer.

BACKGROUND ART

Printers that output receipts are widely used for shop registers and automated teller machines (ATMs) or cash dispensers (CDs) in banks. Such printers that output receipts perform printing on recording paper with a head while conveying the recording paper, and after conveying the recording paper to a predetermined length, cuts the recording paper to the predetermined length with a cutter.

Such printers include, for example, a printer body and a lid pivotably supported on the printer body, and a recording paper roll may be loaded in the printer body by opening the lid. In this case, for example, a head is provided in the printer body, and a platen roller is provided on the lid. By closing the lid, the recording paper is held between the head and the platen roller. Printing by the thermal head is performed on the recording paper thus held between the head and the platen roller.

According to printers that use a recording paper roll, the recording paper roll is loaded in a recording paper holder. While the recording paper roll is generally loaded in the recording paper holder with a shaft passing through the center opening of the recording paper, recently, drop-type printers in which recording paper is directly loaded in the recording paper holder without passing a shaft through the center opening of the recording paper in order to facilitate replenishment of recording paper are becoming popular.

PRIOR ART DOCUMENT

Patent Document

[Patent Document 1] Japanese Laid-Open Patent Application No. 2009-96595

SUMMARY OF THE INVENTION

Problems to be Solved by the Invention

According to drop-type printers, however, a recording paper roll has a high degree of freedom, and therefore, may become loose and spread to affect conveyance of the recording paper while printers are in use.

Therefore, there is a demand for drop-type printers capable of preventing a recording paper roll from becoming loose.

Furthermore, according to drop-type printers, a recording paper roll is more likely to freely move inside the recording paper holder as the recording paper roll becomes smaller in diameter, thus preventing detection of a near-end state where the recording paper is near its end and is running out.

Therefore, there is a demand for drop-type printers capable of detecting the near-end state of recording paper.

Means for Solving the Problems

According to an aspect of the present invention, a printer includes a printer body and a lid. The printer body includes a recording paper holder configured to accommodate a roll of recording paper and a projection provided on a bottom surface of the recording paper holder that contacts the recording paper. The lid is attached to the printer body to be opened and closed relative to the printer body.

According to an aspect of the present invention, a printer includes a printer body, a lid, and a sensor. The printer body includes a recording paper holder configured to accommodate a roll of recording paper, and a projection provided on an interior bottom surface of the recording paper holder. The lid is attached to the printer body to be opened and closed relative to the printer body. The sensor detects the presence or absence of the recording paper. The sensor is provided between the lid and the projection.

According to an aspect of the present invention, a method of detecting a near-end state of recording paper in a printer includes detecting the recording paper rolled and accommodated inside a recording paper holder of a printer body of the printer with a sensor provided between a lid and a projection, the lid being attached to the printer body to be opened and closed relative to the printer body, the projection being provided on an interior bottom surface of the recording paper holder, and determining the detection of the recording paper with the sensor as the detection of the near-end state of the recording paper.

Effects of the Invention

According to an aspect of the present invention, it is possible to prevent a roll of recording paper from becoming loose in drop-type printers.

Furthermore, according to an aspect of the present invention, it is possible to detect the near-end state of recording paper in drop-type printers.

BRIEF DESCRIPTION OF THE DRAWINGS

FIG. 27 is a diagram illustrating the relationship between the presence or absence of detection of recording paper with first, second and third recording paper sensors and the condition of the recording paper.

EMBODIMENTS FOR CARRYING OUT THE INVENTION

Figure 1:
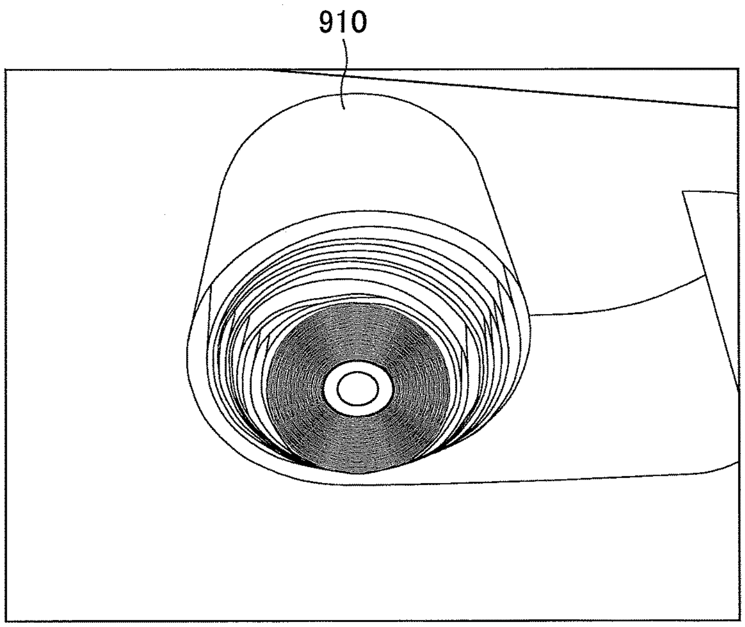
FIG. 1 is a diagram illustrating a roll of recording paper that has loosened and spread.

Embodiments of the present invention are described below. The same member or the like is referred to using the same reference numeral, and a repetitive description thereof is omitted.

First, the loosening and spreading of a roll of recording paper is described. As depicted in FIG. 1, recording paper 910, which is initially tightly rolled, may naturally become loose while being used in a drop-type printer, so that the interval between turns of the recording paper 910 may increase to form a space between turns of the recording paper 910.

Figure 2:
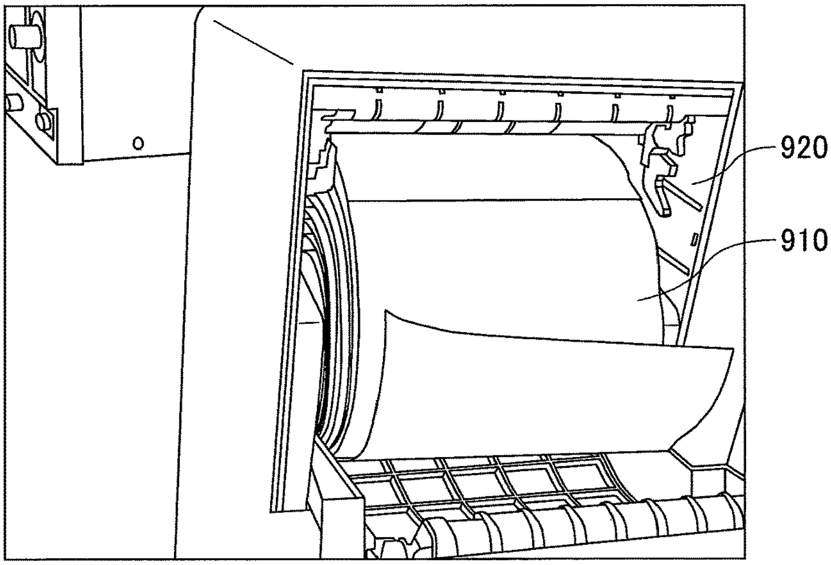
FIG. 2 is a diagram illustrating a roll of recording paper that has loosened and spread.

Accordingly, as depicted in FIG. 2, when the roll of recording paper 910 becomes loose and spreads inside a recording paper holder 920 in which the roll of recording paper 910 is loaded, the loosened recording paper 910 spreads all over inside the recording paper holder 920 to increase the conveyance load of the recording paper 910, thus making it difficult to convey the recording paper 910.

The phenomenon that the roll of recording paper 910 loosens and spreads during its use, which may also occur in printers that include a shaft for loading recording paper, is conspicuous in particular in drop-type printers. It is inferred that this is because the recording paper 910 loaded inside the recording paper holder 920 has a high degree of freedom to be freely movable inside the recording paper holder 920 in the case of drop-type printers. That is, in the case of drop-type printers, because the recording paper 910 is allowed to roll on an internal bottom surface of the recording paper holder 920 or to vertically move through vibrations, the roll of recording paper 910 naturally loosens and spreads during its use. When the recording paper 910 loosens to spread all over inside the recording paper holder 920, the recording paper 910 cannot rotate inside the recording paper holder 920, thus affecting the conveyance of the recording paper 910.

First Embodiment

Figure 3:
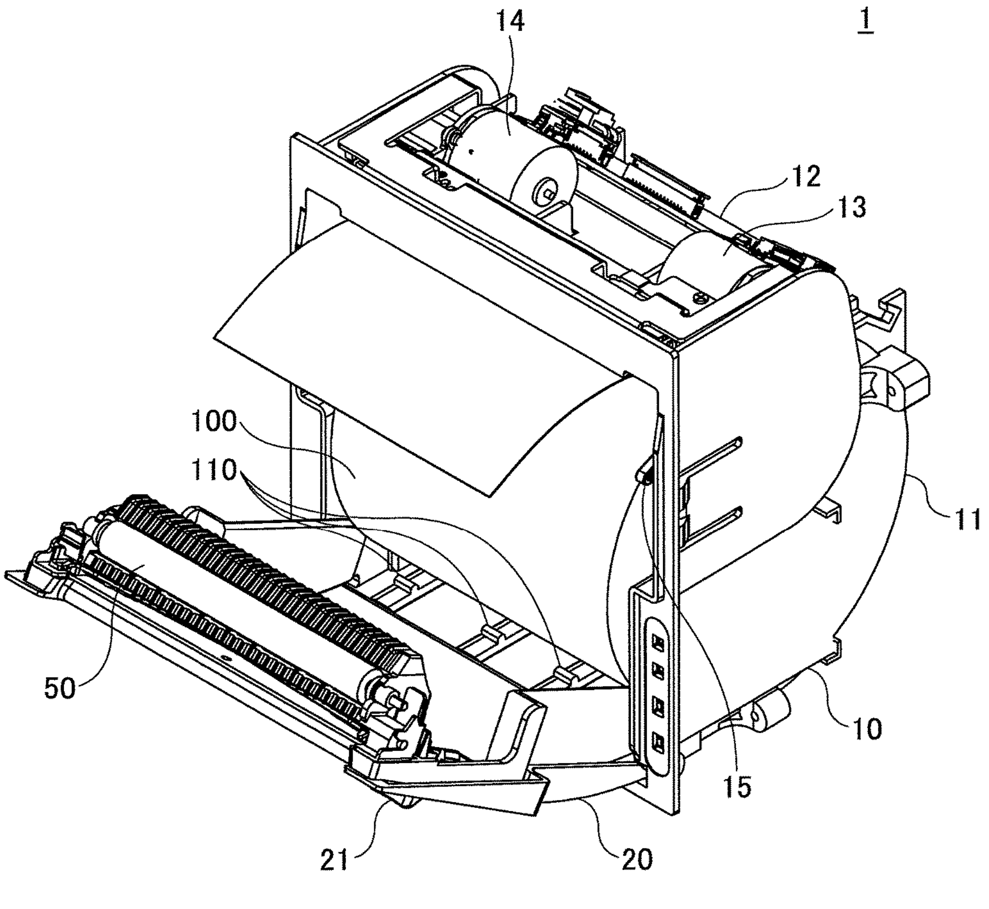
FIG. 3 is a perspective view of a printer according to a first embodiment, where a lid is open (with recording paper).
Figure 4:
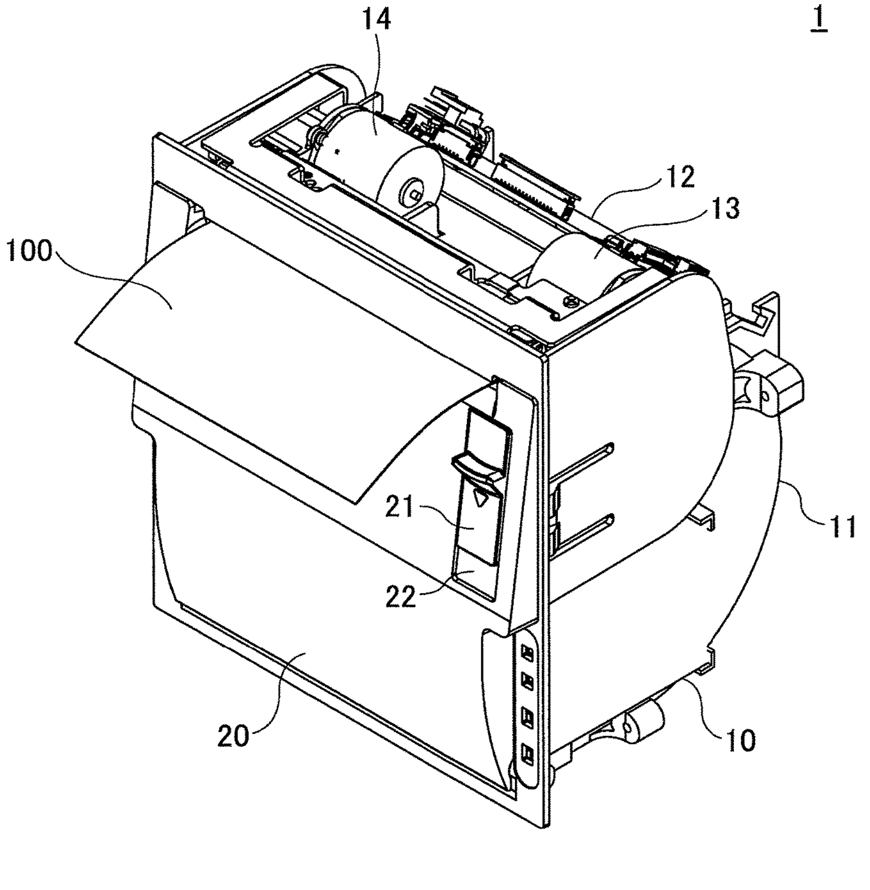
FIG. 4 is a perspective view of the printer according to the first embodiment, where the lid is closed.
Figure 5:
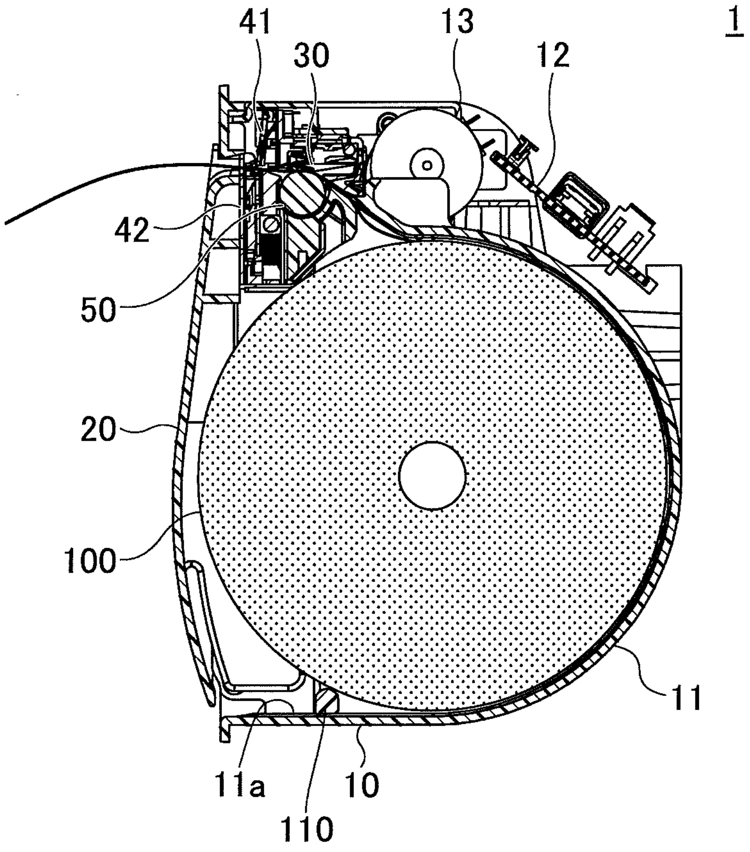
FIG. 5 is a cross-sectional view of the printer according to the first embodiment, where the lid is closed.
Figure 6:
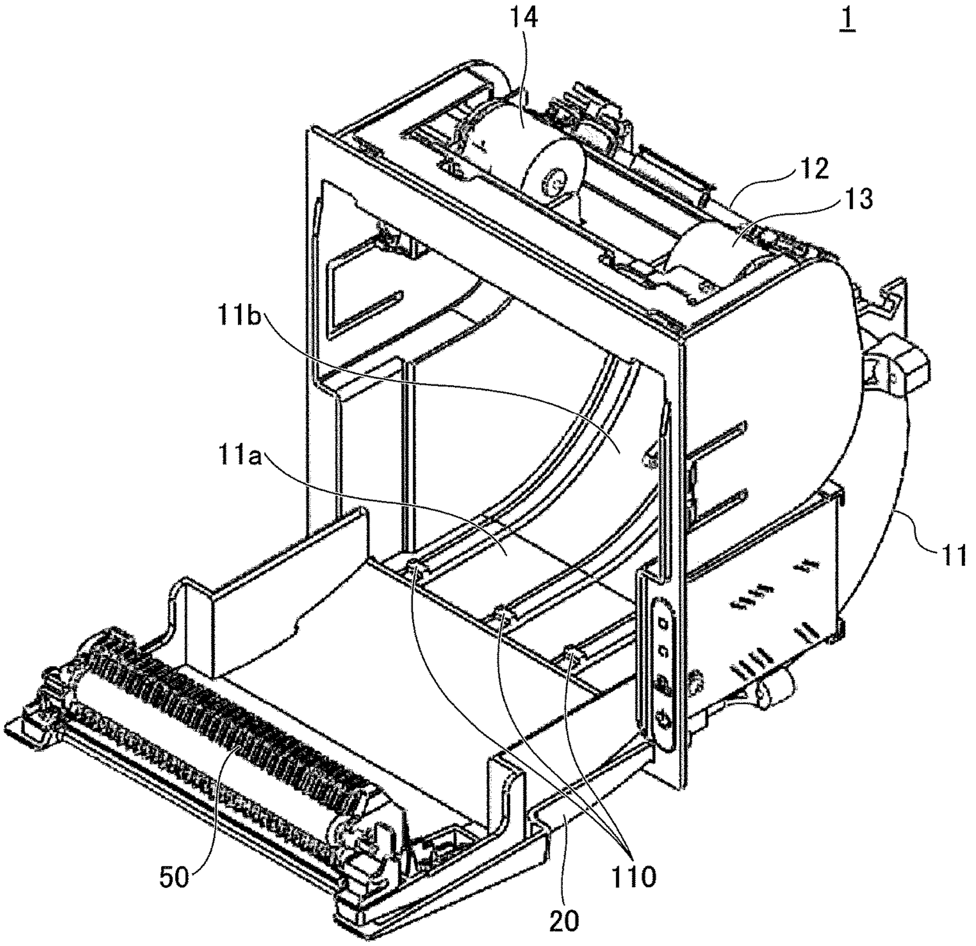
FIG. 6 is a perspective view of the printer according to the first embodiment, where the lid is open (without recording paper).

A printer according to a first embodiment is described with reference to FIGS. 3 through 6. FIG. 3 is a perspective view of the printer according to this embodiment, where a lid is open. FIG. 4 is a perspective view of the printer according to this embodiment, where the lid is closed. FIG. 5 is a cross-sectional view of the printer according to this embodiment, where the lid is closed. FIG. 6 is a perspective view of the printer according to this embodiment, where the lid is open and no recording paper is accommodated.

A printer 1 according to this embodiment includes a printer body 10 and a lid 20 attached to the printer body 10. The lid 20 is attached to the printer body 10 to be pivotable on or about a shaft and openable and closable relative to the printer body 10. A recording paper holder 11 that accommodates a roll of recording paper 100 is provided inside the printer body 10. The recording paper 100 used in the printer 1 is thermal paper.

A circuit board 12, motors 13 and 14, a thermal head 30, which is a recording head that performs printing on the recording paper 100, and a fixed blade 41 are provided in the printer body 10. The circuit board 12 is for controlling the printer 1. Each of the motors 13 and 14 is for conveying the recording paper 100 or driving the movable blade of a cutter to cut the recording paper 100.

An open lever 21 for opening the lid 20, a movable blade 42, and a platen roller 50 are provided on the lid 20. The open lever 21 is provided to move upward and downward in a groove 22 provided in a surface of the lid 20.

According to this embodiment, the fixed blade 41 provided in the printer body 10 and the movable blade 42 provided on the lid 20 form a cutter that cuts the recording paper 100. The movable blade 42 moves toward the fixed blade 41 to cut the recording paper 100 between the fixed blade 41 and the movable blade 42.

Furthermore, the printer body 10 is provided with a lock lever 15 for detaching the platen roller 50 pressed against the thermal head 30. By pressing the lock lever 15 downward, the platen roller 50 is separated from the thermal head 30, so that the platen roller 50 can be disengaged from the printer body 10.

That is, according to the printer 1, by sliding the open lever 21 provided on the lid 20 downward to press the lock lever 15, it is possible to detach the platen roller 50 from the printer body 10 and open the lid 20.

When the platen roller 50 is detached from the printer body 10 by operating the lock lever 15, the platen roller 50 urged by a spring provided in a printer mechanism part including the thermal head 30 and the platen roller 50 is pushed out. Therefore, according to this embodiment, a force due to the spring, that is, a force exerted in a direction to push out the platen roller 50 by the spring, is applied as part of a force to open the lid 20.

In the case of loading the printer 1 with the recording paper 100, the roll of recording paper 100 is loaded inside the recording paper holder 11, and the lid 20 is closed. As a result, the recording paper 100 is set in the printer 1. The printer 1 may alternatively have the platen roller 50 provided in the printer body 10 and have the thermal head 30 provided on the lid 20. The lid 20 is opened when, for example, the recording paper 100 loaded in the printer body 10 runs out or is replaced.

As depicted in FIGS. 5 and 6, according to the printer 1, an interior surface of the recording paper holder 11 is formed to include a substantially flat bottom surface 11*a* and a curved surface 11*b* that is continuous with the bottom surface 11*a* and has a shape corresponding to the shape of the unused recording paper 100 in the initial state.

According to this embodiment, one or more projections 110 (which may be hereinafter collectively referred to as "projection 110") are provided inside the recording paper holder 11 as depicted in FIGS. 3 and 6.

The projection 110 is provided on the interior bottom surface 11*a* of the recording paper holder 11, namely, a surface of the recording paper holder 11 that contacts the recording paper 100 when the roll of recording paper 100 is loaded in the recording paper holder 11, between the recording paper 100 and the lid 20 in the state of FIG. 5. The projection 110 is provided at a position where the projection 110 does not contact the roll of recording paper 100 of a maximum diameter, namely, a new roll of recording paper 100 initially loaded in the recording paper holder 11, between part of the recording paper 100 that contacts the bottom surface 11*a* and the lid 20. The projection 110 is formed on the bottom surface 11*a* of the recording paper holder 11 at a position where the distance to the lid 20 is shorter than at least the radius of the roll of recording paper 100 in its initial state where the roll of recording paper 100 has a maximum diameter.

The number of projections 110 provided may be one or more. When multiple projections 110 are provided, the projections 110 may be formed to be arranged in a direction parallel to an axial direction of the recording paper 100. In FIGS. 3 and 6, three projections 110 are formed to be parallel to an axial direction of the recording paper 100. Furthermore, in the case where a single projection 110 is provided, one of the three projections 110 depicted in FIGS. 3 and 6 may be formed.

The interior curved surface 11*b* of the recording paper holder 11 is formed to have a shape corresponding to the initial state of the recording paper 100.

Next, the case of using the recording paper 100 loaded inside the recording paper holder 11 in the printer 1 of this embodiment is described with reference to FIGS. 7 through 11. FIGS. 7 through 11 are schematic diagrams illustrating the recording paper 100 loaded in the printer 1. In FIGS. 7 through 11, the interior side of the lid 20 is indicated by a one-dot chain line s1, and a line tangent to the curved surface 11*b* at the deepest part of the interior side of the recording paper holder 11 is indicated by a one-dot chain line s2. A distance L between the one-dot chain lines s1 and s2 is substantially equal to or greater than the diameter of the roll of recording paper 100 in the initial state. Furthermore, the bottom of the recording paper holder 11 may be formed of the substantially flat bottom surface 11*a* from the midpoint between the one-dot chain lines s1 and s2 toward the one-dot chain line s1, and be formed of the curved surface 11*b* from the midpoint between the one-dot chain lines s1 and s2 toward the one-dot chain line s2. That is, the bottom of the recording paper holder 11 may be formed of the substantially flat bottom surface 11*a* from the one-dot chain line s1 side to the midpoint between the one-dot chain lines s1 and s2, at which the distance from the one-dot chain line s1 is L/2. The projection 110 is formed in the middle of the bottom surface 11*a*. Specifically, the projection 110 is positioned at a distance L1 from the one-dot chain line s1 on the bottom surface 11*a*.

Figure 7:
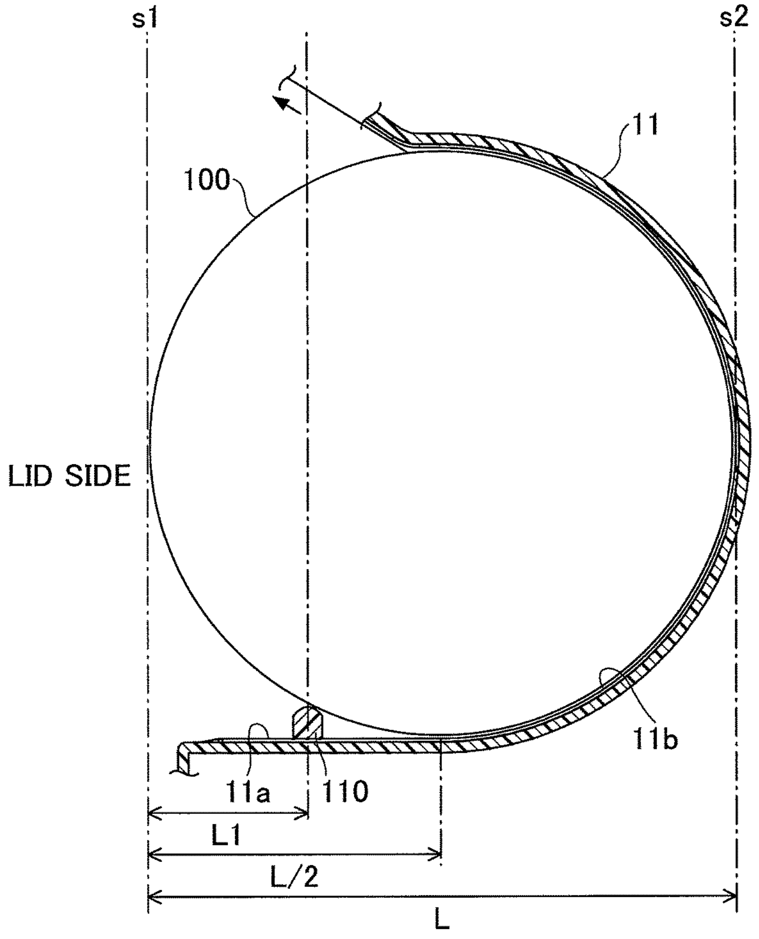
FIG. 7 is a diagram illustrating the recording paper loaded in the printer according to the first embodiment.

First, as depicted in FIG. 7, a new roll of the recording paper 100 is placed inside the recording paper holder 11. The curved surface 11*b* is formed to have a radius of curvature slightly greater than the radius of curvature of the recording paper 100 in the state of FIG. 7. In this state, the recording paper 100 is fed while rotating inside the recording paper holder 11. The recording paper 100, however, hardly rotates to move from its initial placement position inside the recording paper holder 11 because the recording paper 100 has a shape close to the shape of the recording paper holder 11.

Figure 8:
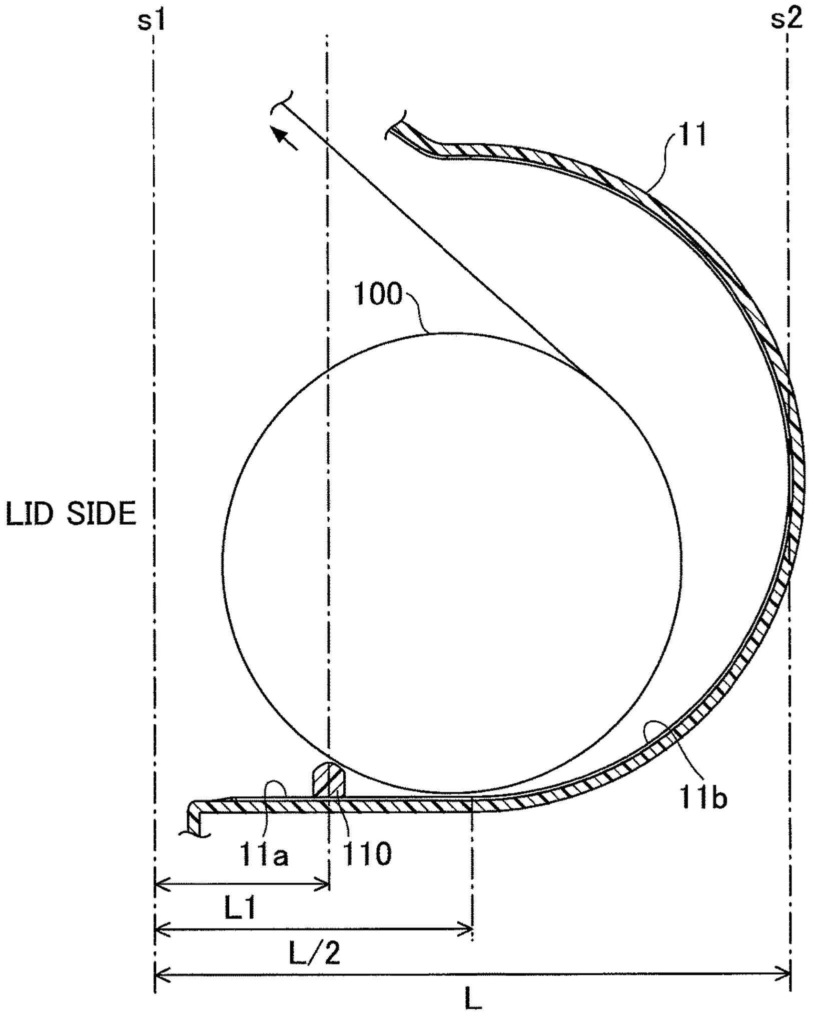
FIG. 8 is a diagram illustrating the recording paper loaded in the printer according to the first embodiment.

As depicted in FIG. 8, when the recording paper 100 is subjected to printing and used, the diameter of the recording paper 100 is slightly reduced compared with the state of FIG. 7. In the state of FIG. 8, the recording paper 100 is in contact with part of the bottom surface 11*a* or the curved surface 11*b* of the recording paper holder 11. Accordingly, because the diameter of the recording paper 100 is small relative to the interior size of the recording paper holder 11, the recording paper 100 may rotate to move inside the recording paper holder 11. Because the recording paper holder 11 includes the projection 110 and the curved surface 11*b*, however, the movement of the recording paper 100 due to rotation is limited to between the projection 110 and the curved surface 11*b*. Accordingly, in the state of FIG. 8, the movement of the recording paper 100 due to rotation inside the recording paper holder 11 is reduced.

Figure 9:
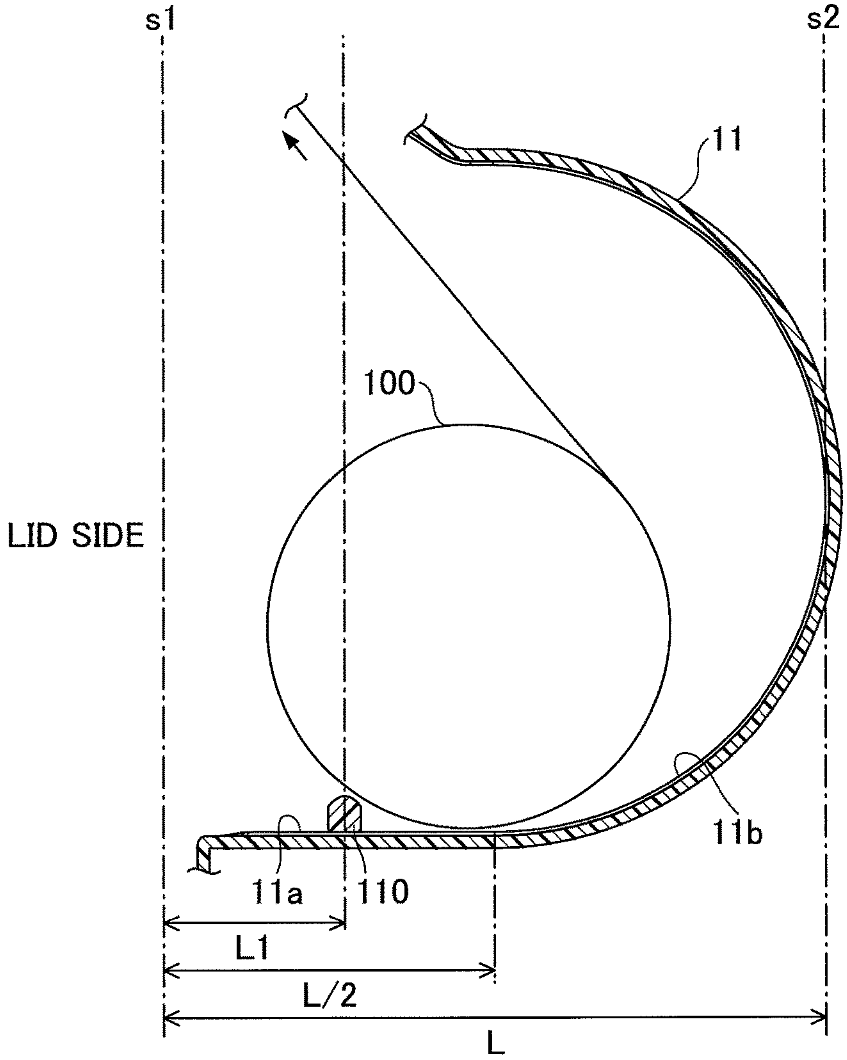
FIG. 9 is a diagram illustrating the recording paper loaded in the printer according to the first embodiment.

As depicted in FIG. 9, when the recording paper 100 is further subjected to printing and used, the diameter of the recording paper 100 is further reduced compared with the state of FIG. 8. In the state of FIG. 9 as well, the recording paper 100 is in contact with part of the bottom surface 11*a* or the curved surface 11*b* of the recording paper holder 11. In this state as well, the diameter of the recording paper 100 is small relative to the interior size of the recording paper holder 11. Therefore, it is possible for the recording paper 100 to rotate to move inside the recording paper holder 11. Because the projection 110 and the curved surface 11*b* are formed, however, the movement of the recording paper 100 due to rotation is limited to between the projection 110 and the curved surface 11*b*. Accordingly, in the state of FIG. 9 as well, the movement of the recording paper 100 due to rotation inside the recording paper holder 11 is reduced.

Figure 10:
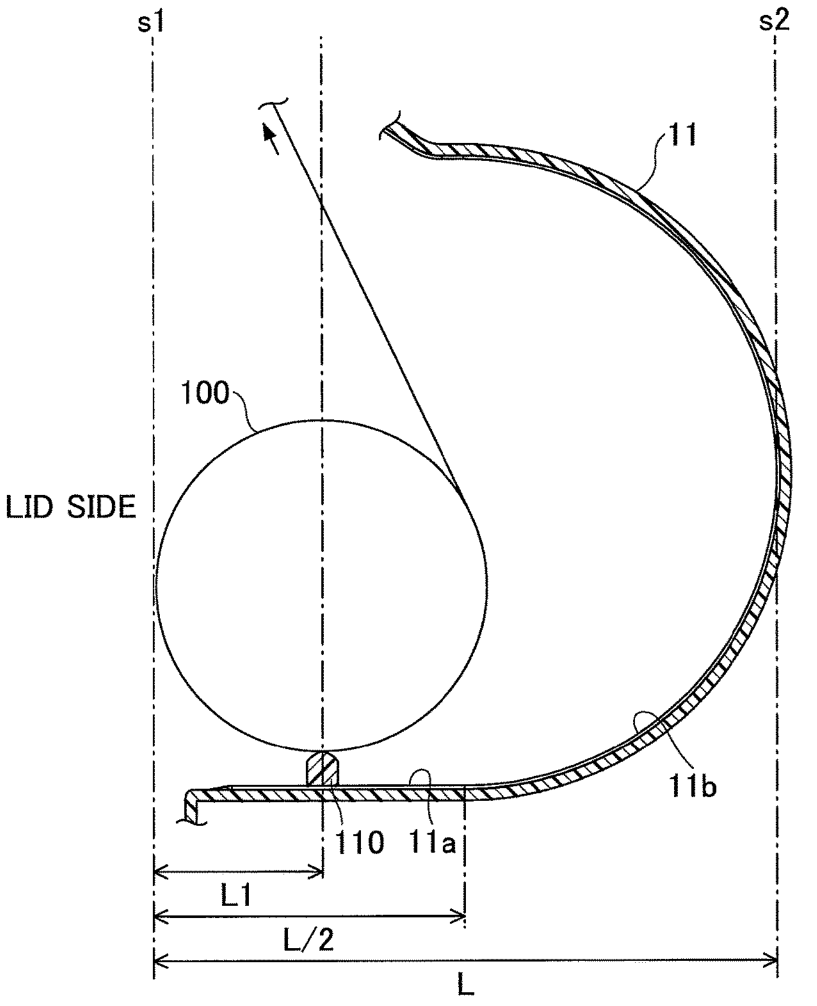
FIG. 10 is a diagram illustrating the recording paper loaded in the printer according to the first embodiment.

As depicted in FIG. 10, when the recording paper 100 is further subjected to printing and used, the diameter of the recording paper 100 is further reduced compared with the state of FIG. 9. In the state of FIG. 10, the radius of the recording paper 100 is substantially equal to the distance L1. Therefore, as depicted in FIG. 10, the recording paper 100 may be on top of the projection 110.

Figure 11:
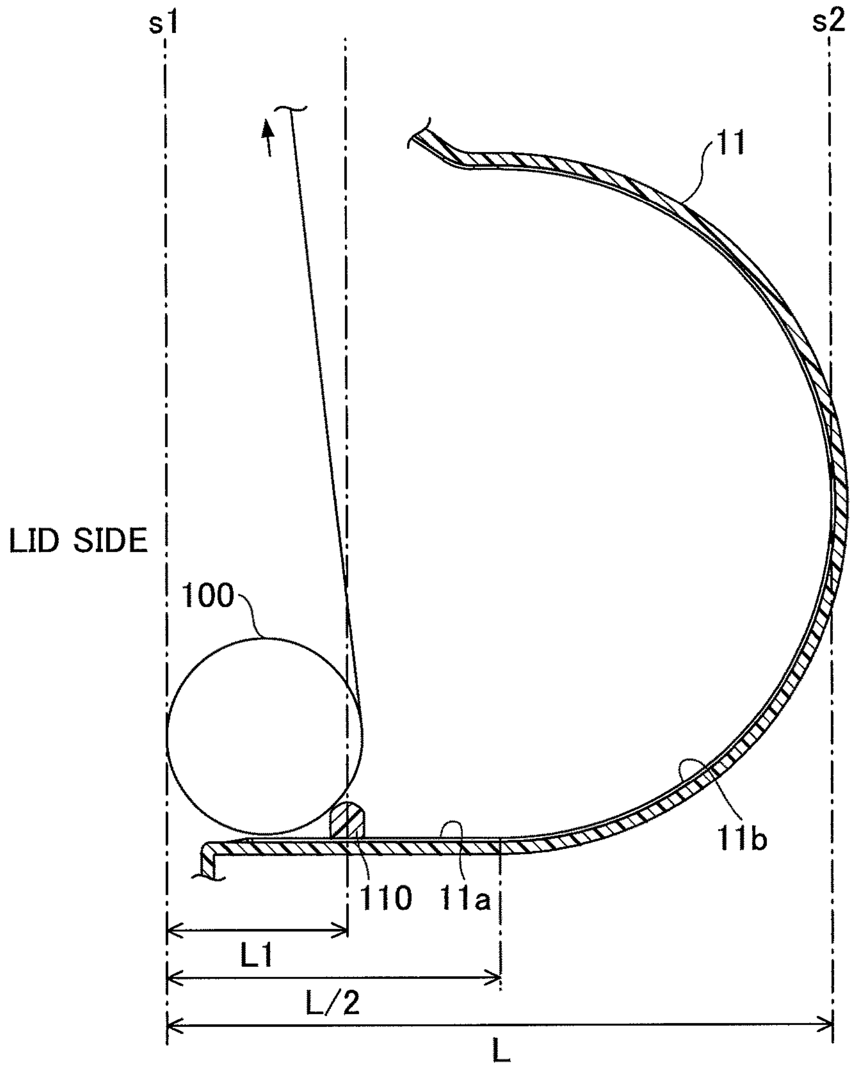
FIG. 11 is a diagram illustrating the recording paper loaded in the printer according to the first embodiment.

As depicted in FIG. 11, when the recording paper 100 is further subjected to printing and used, the diameter of the recording paper 100 is further reduced. In the state of FIG. 11, the diameter of the recording paper 100 is significantly reduced relative to the interior size of the recording paper holder 11 compared with the initial state. Therefore, it is possible for the recording paper 100 to rotate to move inside the recording paper holder 11. The recording paper 100, however, is pulled in the direction indicated by the arrow in FIG. 11 by the platen roller 50 provided on the lid 20. Therefore, the recording paper 100 moves to the lid 20 side of the projection 110. That is, the recording paper 100 is moved to the lid 20 side of the projection 110 by being pulled to the one-dot chain line s1 side on which side the lid 20 is provided. At this point, the recording paper 100 may contact the interior side of the lid 20. In other words, the recording paper 100 may contact the one-dot chain line s1. Accordingly, in the state of FIG. 11, the recording paper 100 is positioned between the projection 110 and the lid 20, so that the movement of the recording paper 100 due to rotation is limited to between the projection 110 and the lid 20. Accordingly, in the state of FIG. 11 as well, the movement of the recording paper 100 due to rotation inside the recording paper holder 11 is reduced.

Thus, according to the printer 1 of this embodiment, by providing the projection 110 on the bottom surface 11*a* of the recording paper holder 11, it is possible to reduce the movement of the recording paper 100 due to rotation inside the recording paper holder 11 even when the diameter of the recording paper 100 is reduced. According to this embodiment, the interior curved surface 11*b* of the recording paper holder 11 preferably has a shape that is similar to part of the surface shape of the roll of recording paper 100.

Second Embodiment

Figure 12:
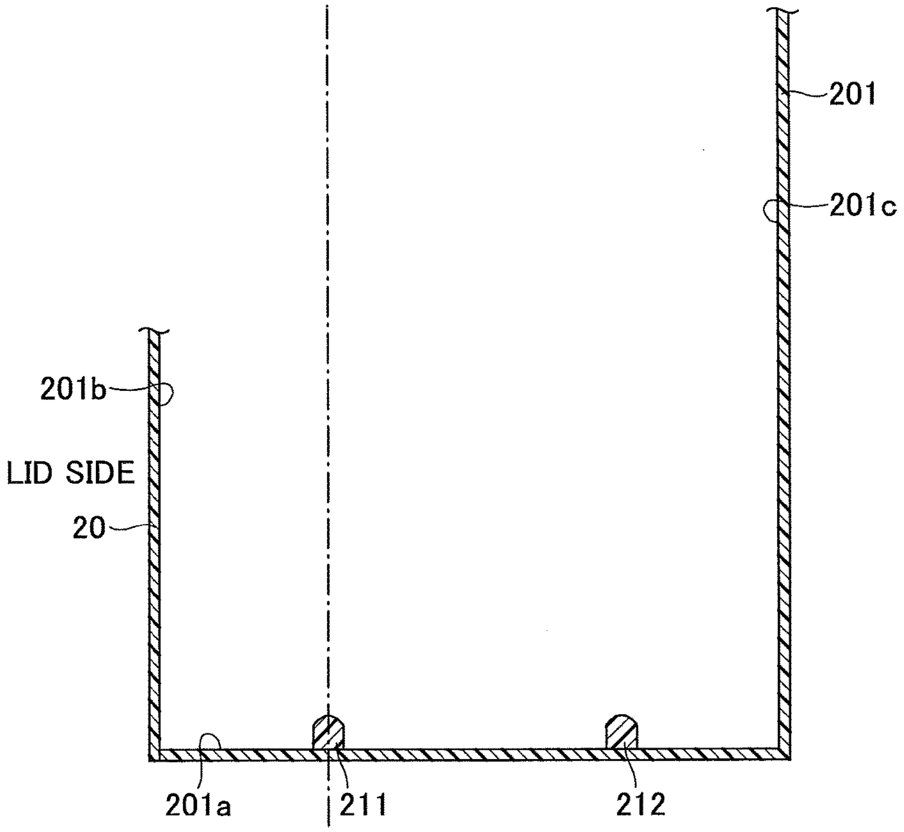
FIG. 12 is a diagram illustrating a printer according to a second embodiment.

Next, a second embodiment is described. According to this embodiment, multiple projections, that is, a first projection 211 and a second projection 212, are provided on an interior bottom surface 201*a* of a recording paper holder 201 of a printer as depicted in FIG. 12. By thus providing the multiple projections 211 and 212 as well, it is possible to reduce the movement of the roll of recording paper 100 due to rotation inside the recording paper holder 201. According to this embodiment, the first projection 211 is provided closer to the lid 20 than the second projection 212. Furthermore, the interior space of the recording paper holder 201 that accommodates the recording paper 100 is surrounded by the bottom surface 201*a*, a lid-side wall face 201*b* formed by the interior side of the lid 20, and an interior recording paper holder wall face 201*c* of the recording paper holder 201 that faces toward the lid side wall surface 201*b*. The interval between the lid-side wall face 201*b* and the recording paper holder wall face 201*c* is substantially equal to or greater than the diameter of the roll of recording paper 100 in the initial state. Furthermore, the interior bottom surface 201*a* of the recording paper holder 201 may be entirely a flat surface without including a curved surface as depicted in FIG. 12.

Next, the case of using the recording paper 100 loaded inside the recording paper holder 201 according to the printer of this embodiment is described.

Figure 13:
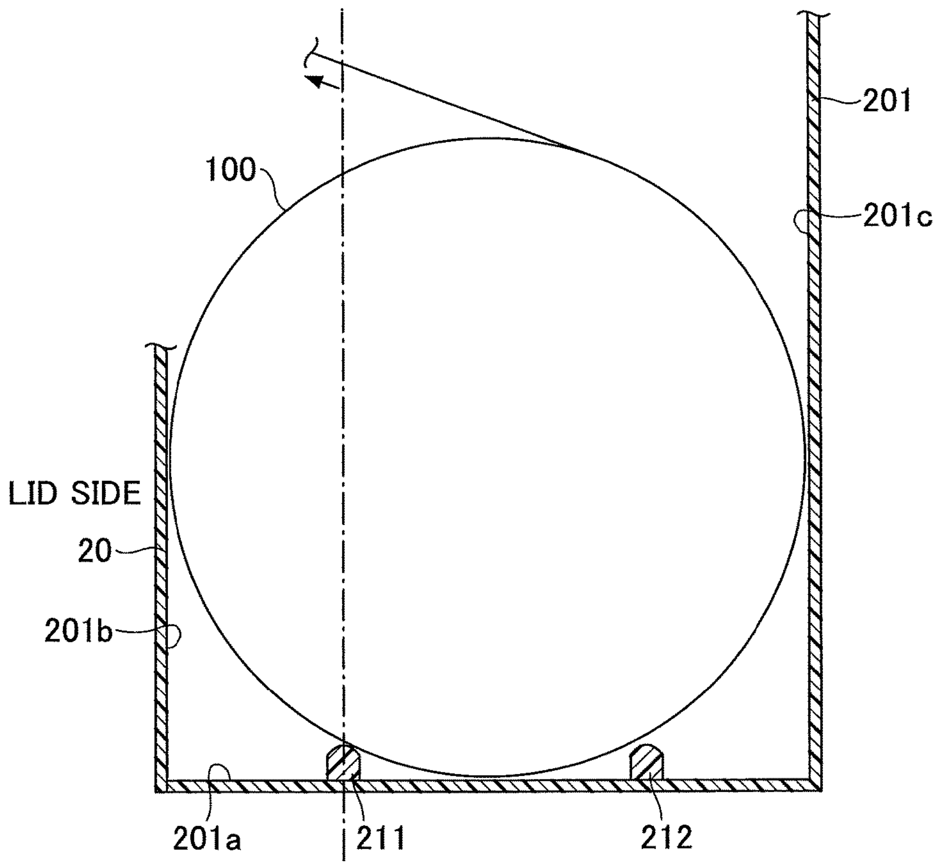
FIG. 13 is a diagram illustrating the recording paper loaded in the printer according to the second embodiment.

First, as depicted in FIG. 13, the recording paper 100 is loaded inside the recording paper holder 201. When the printer performs printing, the recording paper 100 rotates to be fed in the direction of the arrow in FIG. 13. Because the two projections, that is, the first and second projections 211 and 212, are provided on the bottom surface 201*a* of the recording paper holder 201, the movement of the recording paper 100 due to rotation is limited to between the first and second projections 211 and 212. Accordingly, in the state of FIG. 13, the movement of the roll of recording paper 100 due to rotation inside the recording paper holder 201 is reduced.

Figure 14:
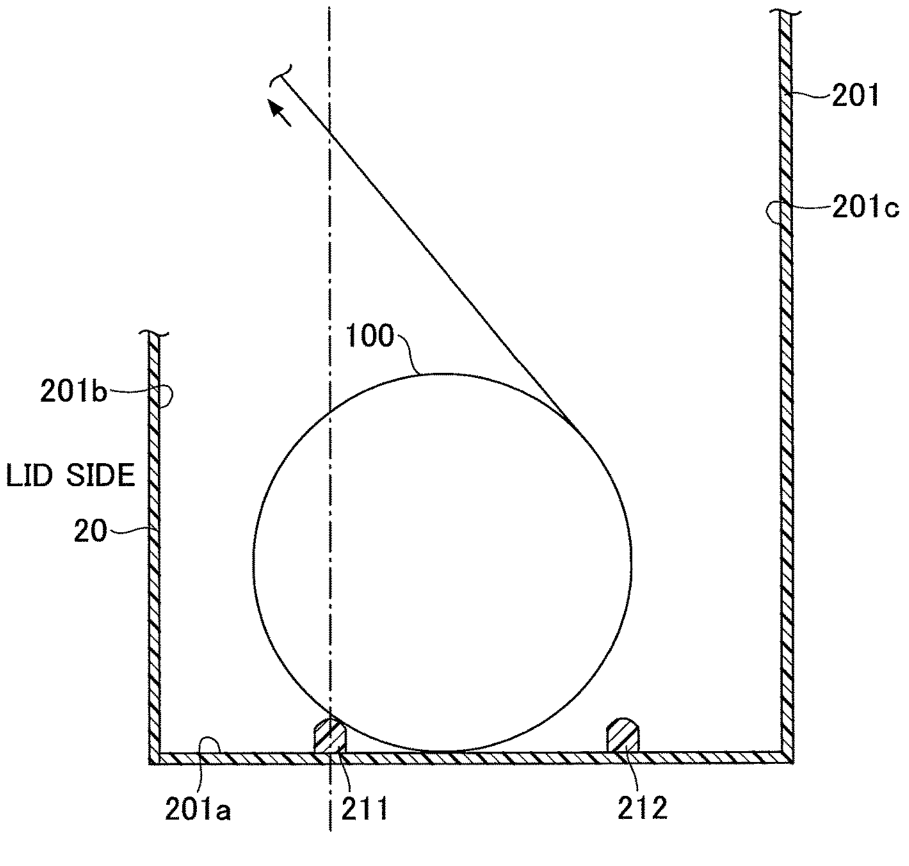
FIG. 14 is a diagram illustrating the recording paper loaded in the printer according to the second embodiment.

When the recording paper 100 is further used, the diameter of the recording paper 100 is reduced as depicted in FIG. 14. In the state of FIG. 14, the movement of the recording paper 100 due to rotation is still limited to between the first and second projections 211 and 212. Therefore, in the state of FIG. 14 as well, the movement of the recording paper 100 due to rotation inside the recording paper holder 201 is reduced.

Figure 15:
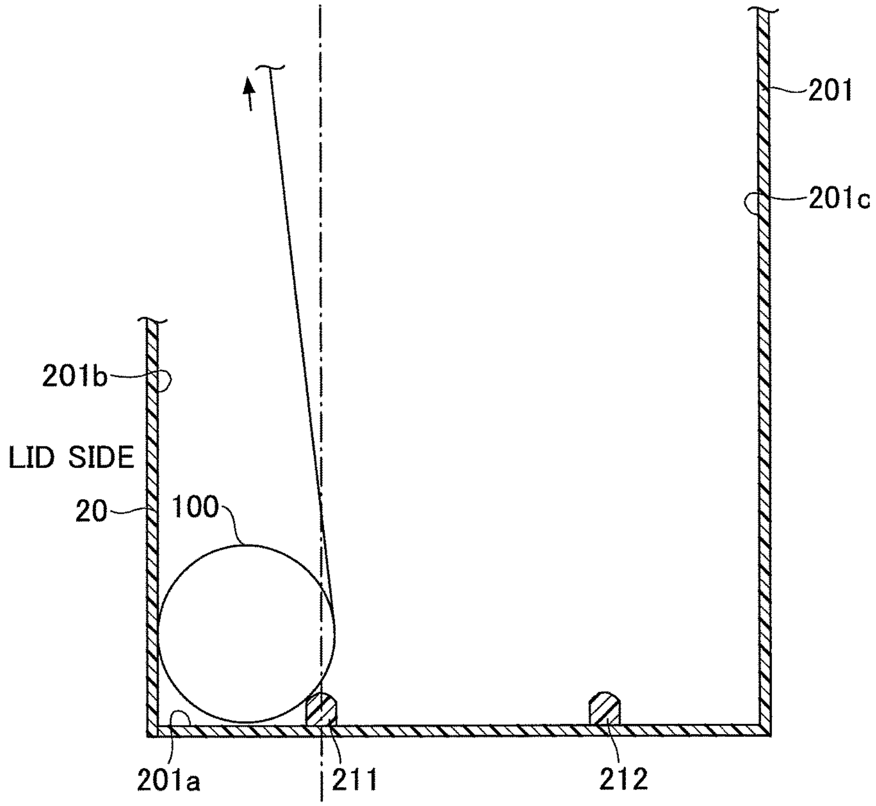
FIG. 15 is a diagram illustrating the recording paper loaded in the printer according to the second embodiment.

As depicted in FIG. 15, when the recording paper 100 is further used, the diameter of the recording paper 100 is reduced compared with the state of FIG. 14. In the state of FIG. 15, the recording paper 100 is in contact with the first projection 211 that is closer to the lid 20 and the lid-side wall face 201*b*, so that the movement of the recording paper 100 due to rotation is limited to between the lid-side wall face 201*b* and the first projection 211. Accordingly, in the state of FIG. 15 as well, the movement of the recording paper 100 due to rotation inside the recording paper holder 201 is reduced.

Thus, according to the printer of this embodiment, by providing the two projections, that is, the first and second projections 211 and 212, on the interior bottom surface 201*a* of the recording paper holder 201, it is possible to reduce the movement of the roll of recording paper 100 due to rotation inside the recording paper holder 201 even when the recording paper 100 is used and reduced in diameter.

In other respects than those described above, the second embodiment may be the same as the first embodiment.

Third Embodiment

Figure 16:
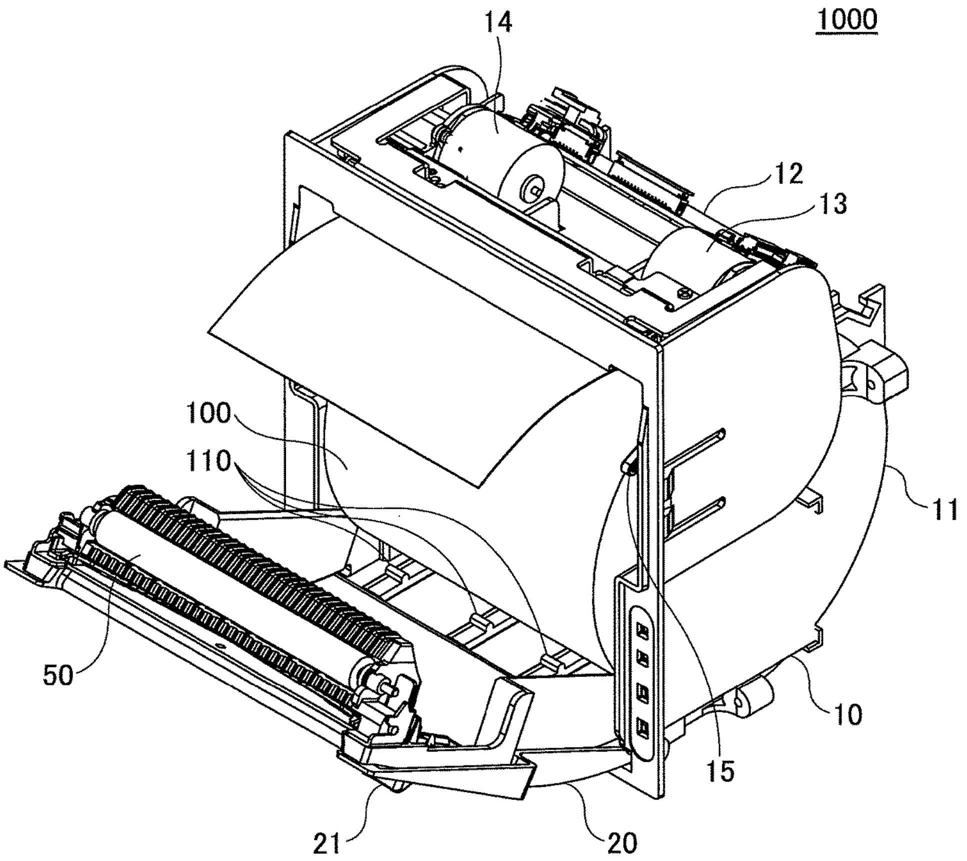
FIG. 16 is a perspective view of a printer according to a third embodiment, where a lid is open.
Figure 17:
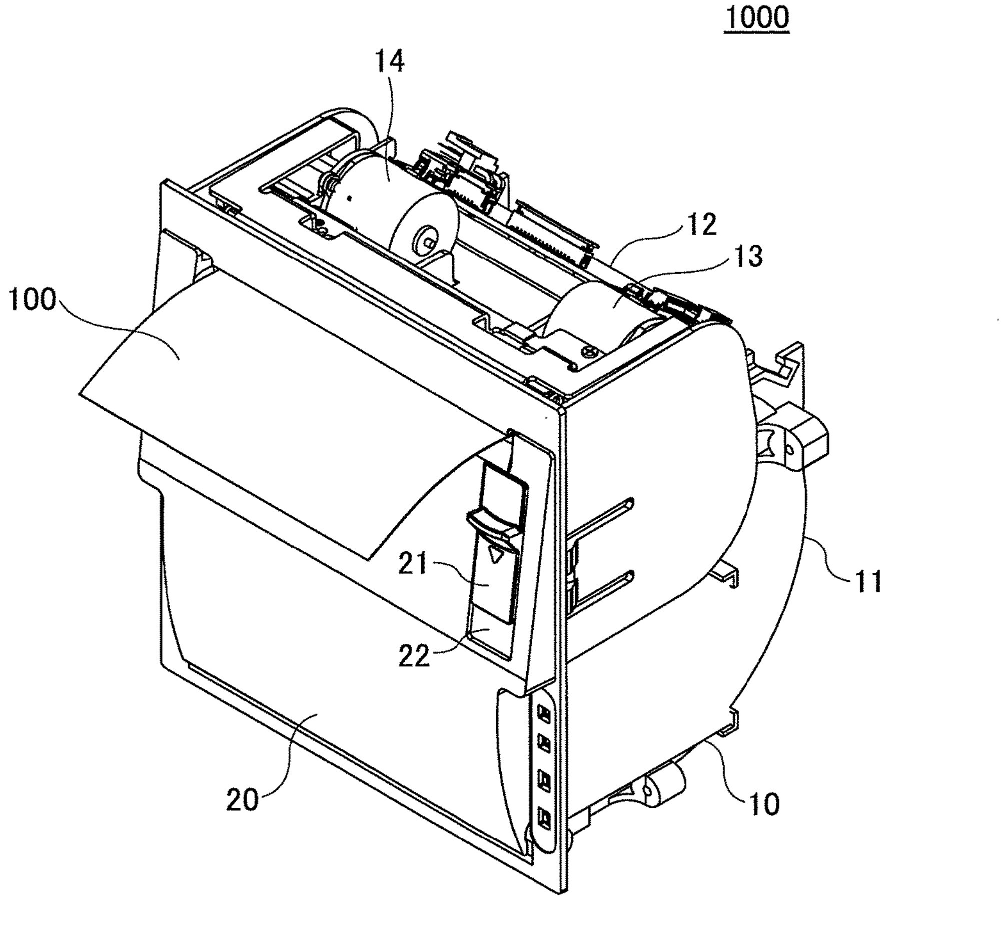
FIG. 17 is a perspective view of the printer according to the third embodiment, where the lid is closed.
Figure 18:
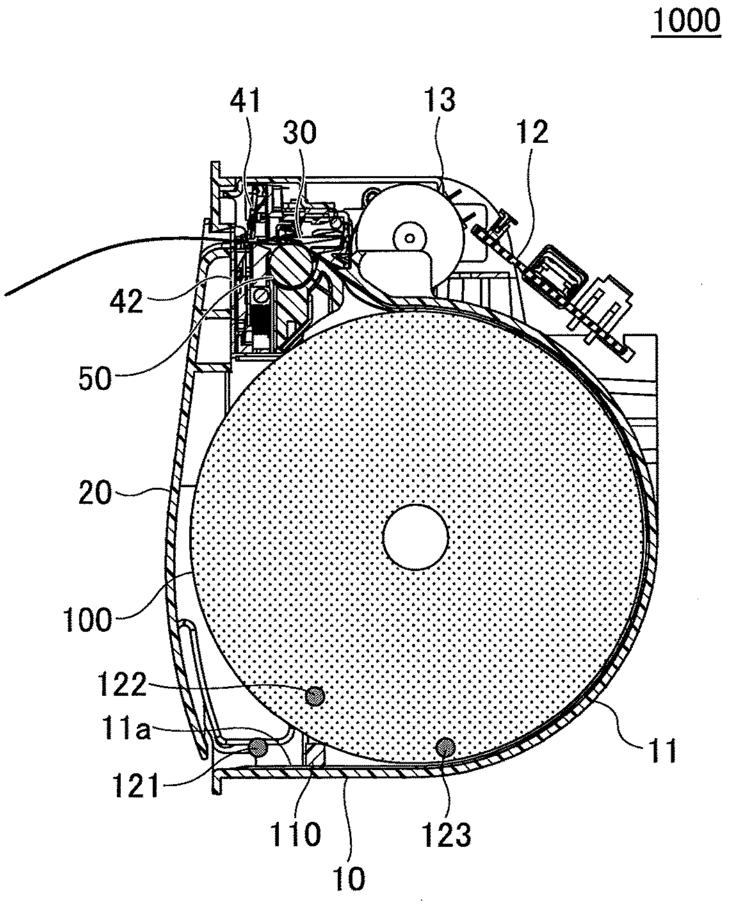
FIG. 18 is a cross-sectional view of the printer according to the third embodiment, where the lid is closed.
Figure 19:
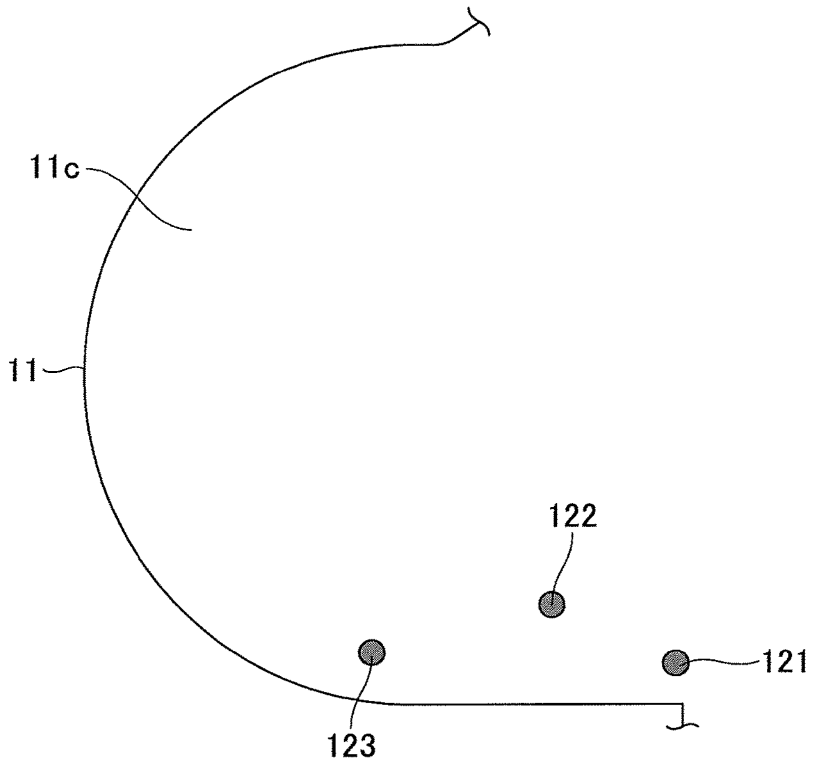
FIG. 19 is a diagram depicting an interior side surface of a recording paper holder of a printer body of the printer according to the third embodiment.

A printer according to a third embodiment is described with reference to FIGS. 16 through 19. FIG. 16 is a perspective view of the printer according to this embodiment, where a lid is open. FIG. 17 is a perspective view of the printer according to this embodiment, where the lid is closed. FIG. 18 is a cross-sectional view of the printer according to this embodiment, where the lid is closed. FIG. 19 is a diagram depicting an interior side surface of a recording paper holder of a printer body of the printer according to this embodiment.

A printer 1000 according to this embodiment may have the same basic configuration as the printer 1 of the first embodiment. The printer 1000 includes the printer body 10 and the lid 20 attached to the printer body 10. The printer body 10 includes the recording paper holder 11.

The control circuit board 12, the motors 13 and 14, the thermal head 30, and the fixed blade 41 are provided in the printer body 10. Furthermore, the printer body 10 is provided with the lock lever 15.

The open lever 21, the movable blade 42, and the platen roller 50 are provided on the lid 20.

According to the printer 1000, by sliding the open lever 21 provided on the lid 20 downward to press the lock lever 15, it is possible to detach the platen roller 50 from the printer body 10 and open the lid 20.

When the platen roller 50 is detached from the printer body 10 by operating the lock lever 15, the platen roller 50 urged by a spring provided in the printer mechanism part is pushed out. Therefore, according to this embodiment, a force due to the spring, that is, a force exerted in a direction to push out the platen roller 50 by the spring, is applied as part of a force to open the lid 20.

In the case of loading the printer 1000 with the recording paper 100, the roll of recording paper 100 is loaded inside the recording paper holder 11 of the printer body 10, and the lid 20 is closed. As a result, the roll of recording paper 100 is set in the printer 1000. The printer 1000 may alternatively have the platen roller 50 provided in the printer body 10 and have the thermal head 30 provided on the lid 20. The lid 20 is opened when, for example, the recording paper 100 loaded in the printer body 10 runs out or is replaced.

According to the printer 1000, the projection 110 is provided inside the recording paper holder 11 as depicted in FIG. 16. The projection 110 may be provided in the same manner as in the first embodiment. Furthermore, a first recording paper sensor 121, a second recording paper sensor 122, and a third recording paper sensor 123 are provided at positions indicated by black circles in FIG. 18 around the projection 110 inside the recording paper holder 11. For example, the first through third recording paper sensors 121 through 123 may be provided on an interior side surface 11*c* of the recording paper holder 11 as depicted in FIG. 19.

By way of example, the first recording paper sensor 121 is provided on the interior side surface 11*c* of the recording paper holder 11 between the projection 110 and the lid 20. By way of example, the second recording paper sensor 122 is provided on the interior side surface 11*c* of the recording paper holder 11 at a position on a line vertical to the projection 110, for example, at a position on a straight line that is, in an axial direction of the roll of recording paper 100, substantially parallel to a vertical line passing through the center of the projection 110. By way of example, the third recording paper sensor 123 is provided on the interior side surface 11*c* of the recording paper holder 11 to be positioned on the opposite side of the projection 110 from the lid 20.

According to this embodiment, while optical sensors such as reflection optical sensors are used for the first through third recording paper sensors 121 through 123, mechanical sensors may alternatively be used.

A method of detecting the near-end state of the recording paper 100 in a printer according to this embodiment is described with reference to FIGS. 20 through 26. According to this embodiment, with reference to a straight line along the direction of gravity that passes through the center of the projection 110, that is, a vertical line L indicated by a one-dot chain line of FIG. 20, a region between the lid 20 (omitted in FIGS. 20 through 26) and the vertical line L is determined as a first region A1, and a region between the vertical line L and an interior surface of the recording paper holder 11 on the side opposite to the lid 20 side is determined as a second region A2. That is, a region on the lid 20 side (left side in FIGS. 20 through 26) of the vertical line L is determined as the first region A1, and a region on the opposite side (right side in FIGS. 20 through 26) of the vertical line L from the lid 20 is determined as the second region A2. Furthermore, the distance from an interior wall surface of the lid 20 to the center of the projection 110 in a plane including the bottom surface 11*a* of the recording paper holder 11 is determined as P. For convenience of description of the position of the recording paper 100, the positional relationship between members and the like is conceptually depicted in FIGS. 20 through 26.

Figure 20:
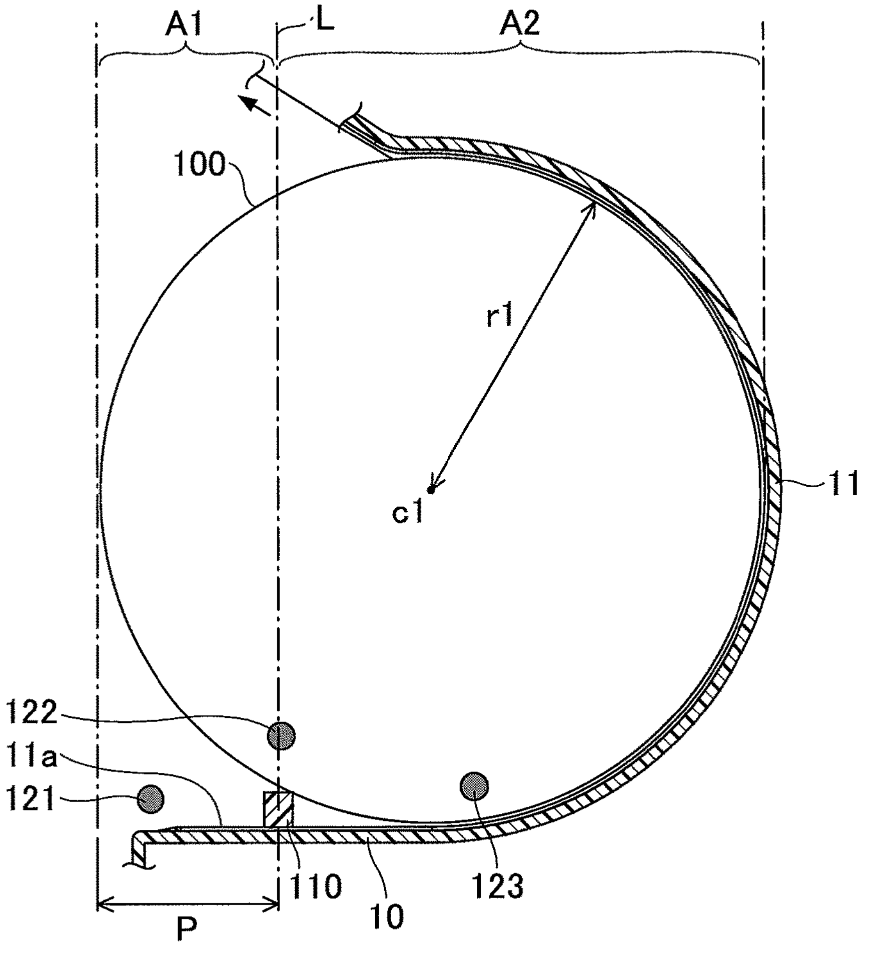
FIG. 20 is a diagram illustrating detection of the near-end state of recording paper in the printer according to the third embodiment.

As depicted in FIG. 20, when the roll of recording paper 100 is initially placed inside the recording paper holder 11, the recording paper 100 occupies substantially the entire region of the space inside the recording paper holder 11. In this state, a radius r1 of the recording paper 100 is greater than the distance P. Therefore, a center c1 of the recording paper 100 is positioned in the second region A2, and the recording paper 100 is in contact with the bottom surface 11*a* of the recording paper holder 11 in the second region A2. Therefore, the recording paper 100 is detected with the second and third recording paper sensors 122 and 123, but is not detected with the first recording paper sensor 121.

Figure 21:
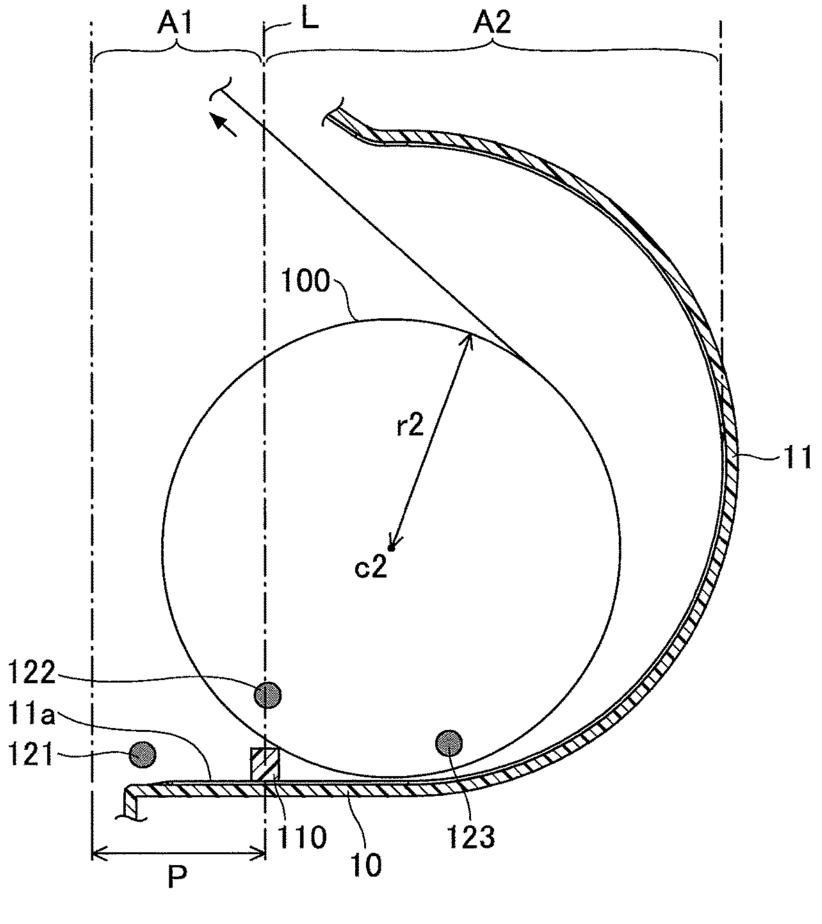
FIG. 21 is a diagram illustrating the detection of the near-end state of recording paper in the printer according to the third embodiment.

Next, when the recording paper 100 is subjected to printing and used in the printer 1000, the radius of the recording paper 100 is reduced to a radius r2 as depicted in FIG. 21. In the state of FIG. 21, however, the radius r2 of the recording paper 100 is still greater than the distance P. Therefore, a center c2 of the recording paper 100 is positioned in the second region A2, and the recording paper 100 is in contact with the bottom surface 11*a* of the recording paper holder 11 in the second region A2. Accordingly, the recording paper 100 is detected with the second and third recording paper sensors 122 and 123, but is not detected with the first recording paper sensor 121.

Figure 22:
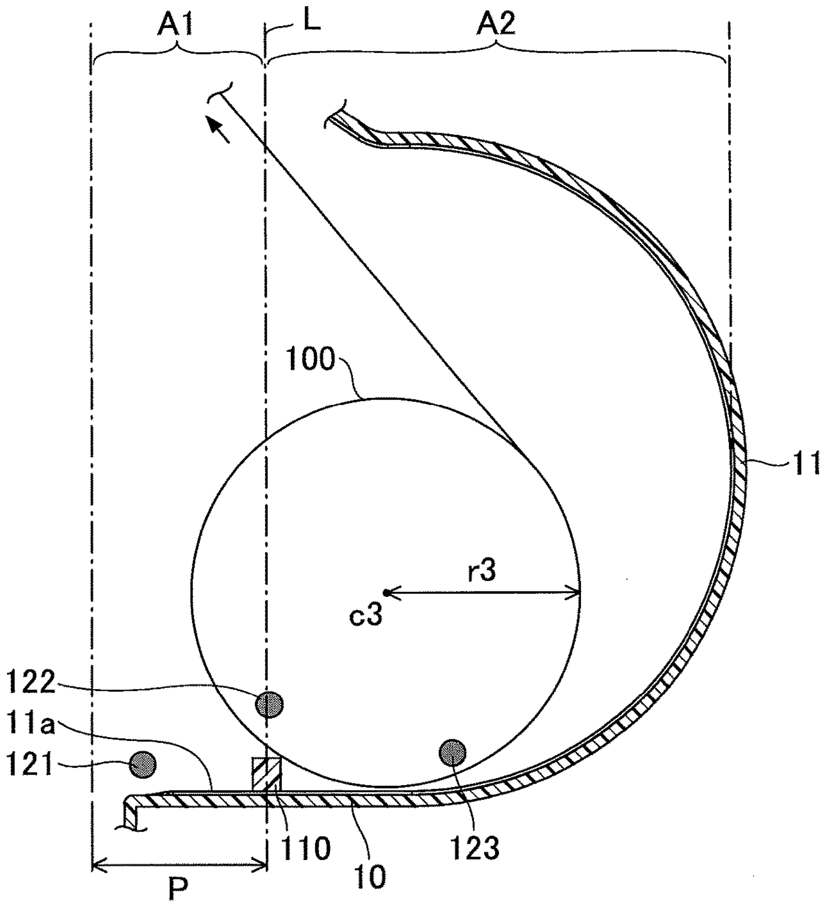
FIG. 22 is a diagram illustrating the detection of the near-end state of recording paper in the printer according to the third embodiment.

Next, when the recording paper 100 in the state of FIG. 21 is further subjected to printing and used, the radius of the recording paper 100 is reduced to a radius r3 as depicted in FIG. 22. In this state, however, the radius r3 of the recording paper 100 is still slightly greater than the distance P. Therefore, a center c3 of the recording paper 100 is positioned in the second region A2, and the recording paper 100 is in contact with the bottom surface 11*a* of the recording paper holder 11 in the second region A2. Accordingly, the recording paper 100 is detected with the second and third recording paper sensors 122 and 123, but is not detected with the first recording paper sensor 121. In the state of FIG. 22, the recording paper 100 is in contact with the projection 110. Therefore, even when the recording paper 100 is pulled in the direction indicated by the arrow in FIG. 22 by the platen roller 50, it is possible to prevent the recording paper 100 from moving to the first region A1 with the projection 110.

Figure 23:
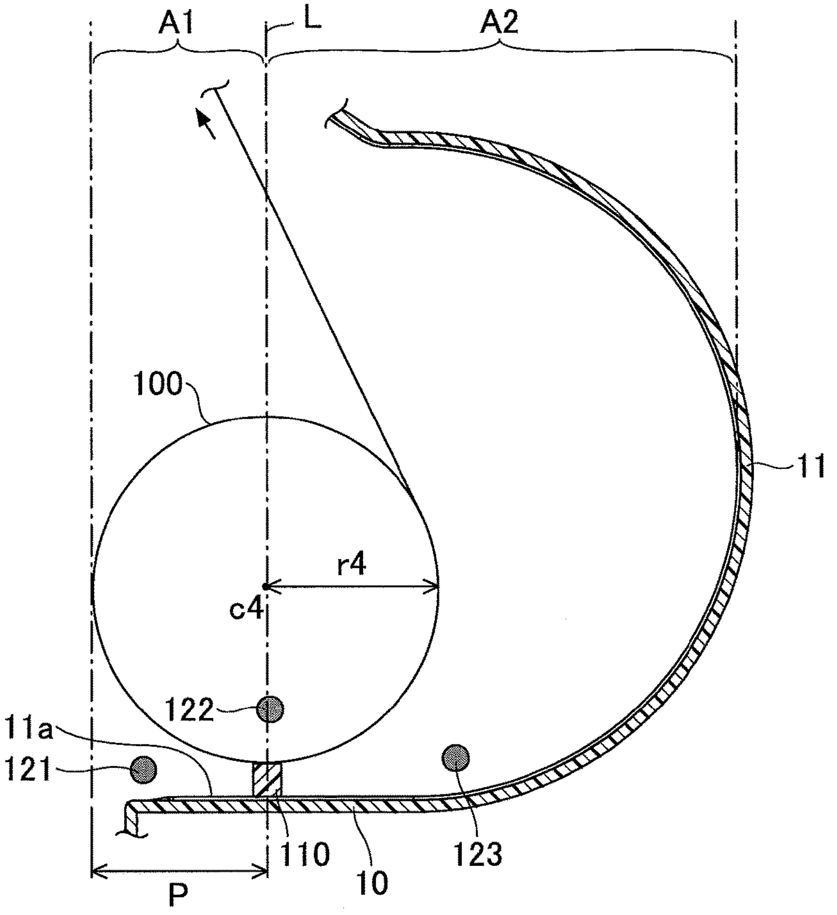
FIG. 23 is a diagram illustrating the detection of the near-end state of recording paper in the printer according to the third embodiment.

Next, when the recording paper 100 is further subjected to printing and used, the radius of the recording paper 100 is reduced to a radius r4 as depicted in FIG. 23. In the state of FIG. 23, the radius r4 of the recording paper 100 is substantially equal to the distance P. Therefore, the recording paper 100 is on top of the projection 110. Therefore, a center c4 of the recording paper 100 is positioned on or near the vertical line L passing through the projection 110. Accordingly, the recording paper 100 is detected with the second recording paper sensor 122, but is not detected with the first or third recording paper sensor 121 or 123.

As described above, the recording paper 100 is pulled by the platen roller 50 provided on the lid 20. Therefore, when the radius r4 of the recording paper 100 is substantially equal to the distance P, the recording paper 100 is drawn toward the lid 20. On the other hand, the recording paper 100 touches the interior of the lid 20 to be prevented from moving leftward in FIG. 23. Accordingly, the recording paper 100 is expected to be on top of the projection 110. Because the radius r4 of the recording paper 100 is small, however, the recording paper 100 may roll on the bottom surface 11*a* of the recording paper holder 11. In this case, the recording paper 100 is not detected with the first recording paper sensor 121, but may be detected with the third recording paper sensor 123 or, on rare occasions, with the second recording paper sensor 122. Accordingly, when the recording paper 100 is not detected with the first or second recording paper sensor 121 or 122 but is detected with the third recording paper sensor 123, it may be determined that the recording paper 100 is rolling on the bottom surface 11*a* of the recording paper holder 11 in the second region A2.

Figure 24:
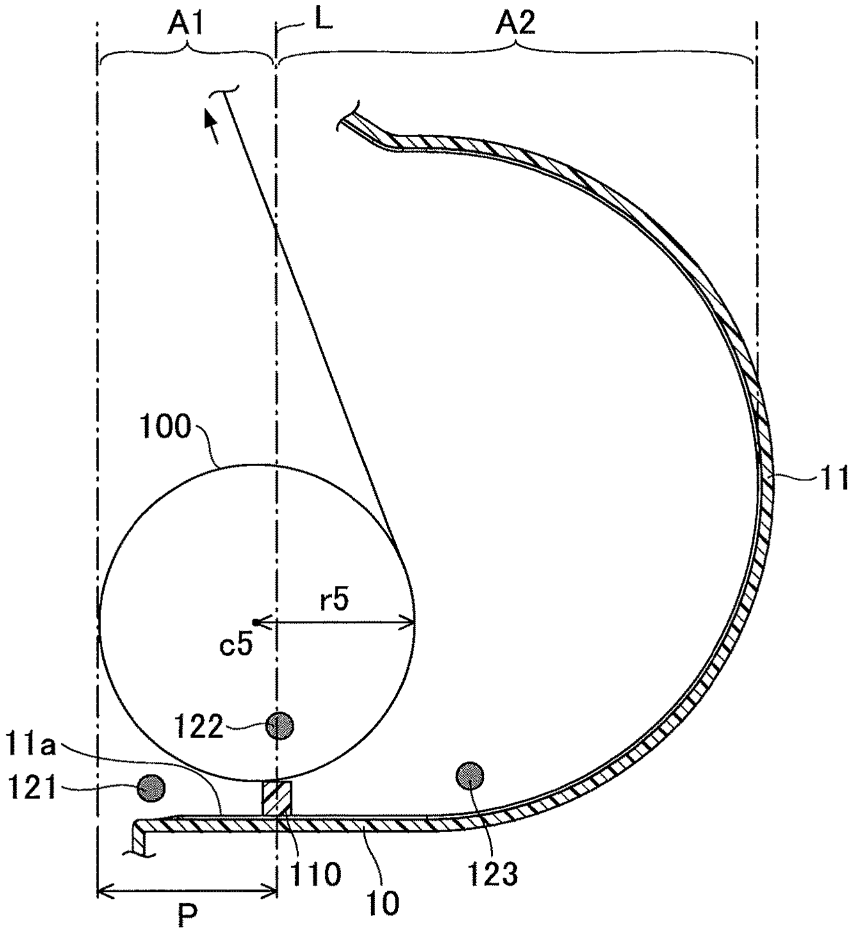
FIG. 24 is a diagram illustrating the detection of the near-end state of recording paper in the printer according to the third embodiment.

Next, when the recording paper 100 is further subjected to printing and used, the radius of the recording paper 100 is reduced to a radius r5 as depicted in FIG. 24. In the state of FIG. 24, the radius r5 of the recording paper 100 is smaller than the distance p, and the recording paper 100 is pulled in the direction indicated by the arrow in FIG. 24 by the platen roller 50 to be drawn toward the lid 20. Therefore, a center c5 of the recording paper 100 is positioned in the first region A1. In this case, the recording paper 100 is detected with the second recording paper sensor 122, but is not detected with the first or third recording paper sensor 121 or 123.

As described above, when the radius r5 of the recording paper 100 is smaller than the distance P, the recording paper

100 is pulled by the platen roller 50 provided on the lid 20 to be drawn toward the lid 20. Therefore, the center c5 of the recording paper 100 is expected to be in the first region A1. Because the radius r5 of the recording paper 100 is small, however, the recording paper 100 may be rolling on the bottom surface 11*a* of the recording paper holder 11 in the second region A2. In this case, the same as in the case of FIG. 23, the recording paper 100 is not detected with the first recording paper sensor 121, but may be detected with the third recording paper sensor 123 or, on rare occasions, with the second recording paper sensor 122.

Figure 25:
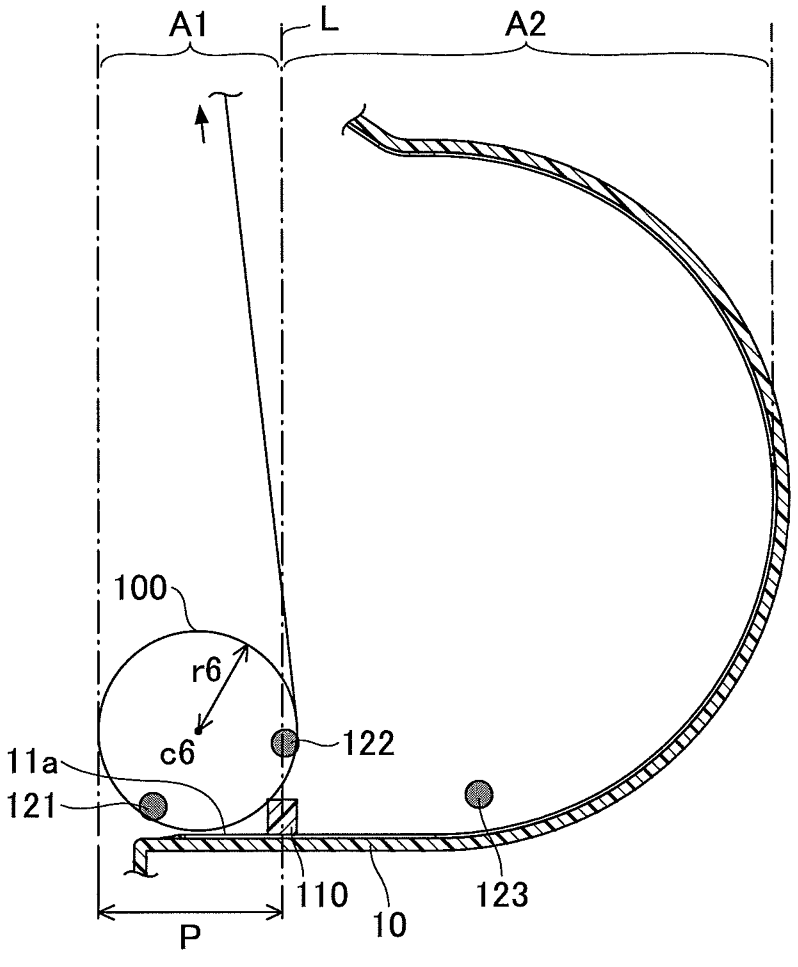
FIG. 25 is a diagram illustrating the detection of the near-end state of recording paper in the printer according to the third embodiment.

When the recording paper 100 in the state of FIG. 24 is further subjected to printing and used, the radius of the recording paper 100 is further reduced to a radius r6 as depicted in FIG. 25. In this state, the radius r6 of the recording paper 100 is smaller than the distance P. Therefore, a center c6 of the recording paper 100 is positioned in the first region A1, and the recording paper 100 is in contact with or is about to contact the bottom surface 11*a* of the recording paper holder 11 in the first region A1. In the case of FIG. 25, the recording paper 100 is detected with the first and second recording paper sensors 121 and 122, but is not detected with the third recording paper sensor 123.

Figure 26:
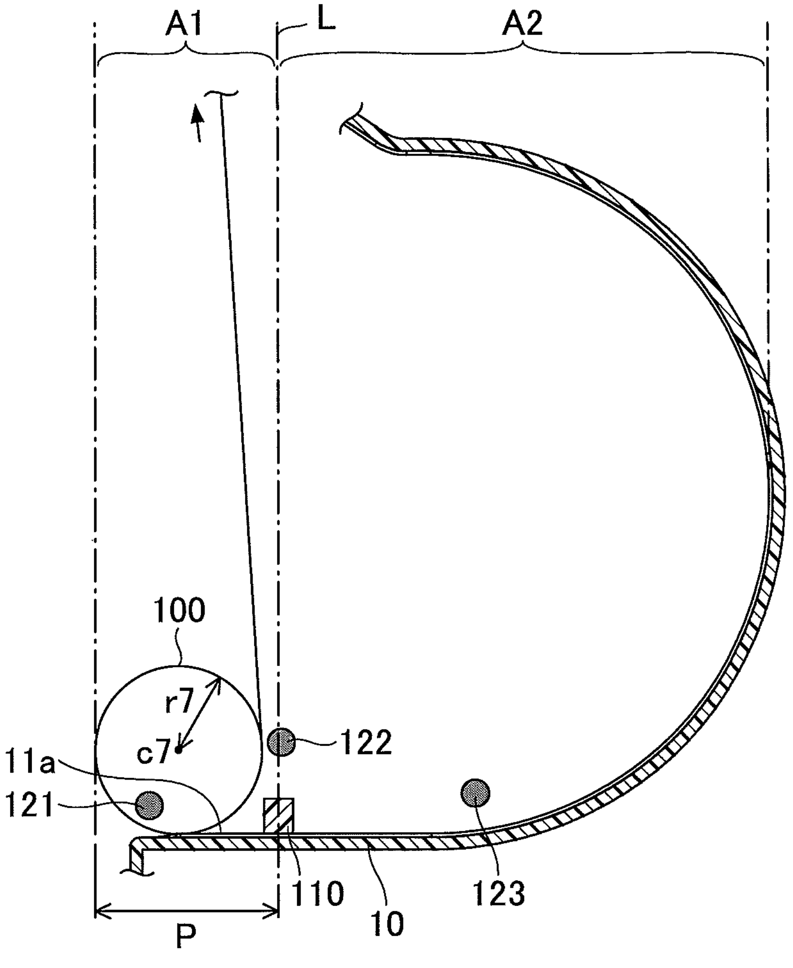
FIG. 26 is a diagram illustrating the detection of the near-end state of recording paper in the printer according to the third embodiment.

When the recording paper 100 in the state of FIG. 25 is further subjected to printing and used, the radius of the recording paper 100 is further reduced to a radius r7 as depicted in FIG. 26. In the state of FIG. 26, the radius r7 of the recording paper 100 is yet smaller than the distance P, and the diameter of the recording paper 100 as well is smaller than the distance P. Therefore, a center c7 of the recording paper 100 is positioned in the first region A1, and the recording paper 100 is in contact with the bottom surface 11*a* of the recording paper holder 11 in the first region A1. In this case, the recording paper 100 is detected with the first recording paper sensor 121, but is not detected with the second or third recording paper sensor 122 or 123.

According to this embodiment, the projection 110 is provided inside the recording paper holder 11. Therefore, when the radius of the recording paper 100 is greater than the radius r6, the projection 110 restricts the movement of the recording paper 100. Therefore, the recording paper 100 is not detected with the first recording paper sensor 121. When the radius of the recording paper 100 is smaller than or equal to the radius r6, however, the recording paper 100 climbs over the projection 110 to contact the bottom surface 11*a* in the first region A1. Therefore, the recording paper 100 is detected with the first recording paper sensor 121. Therefore, it is possible to detect a near-end state where the recording paper 100 has run low using the first recording paper sensor 121.

According to this embodiment, the state where the roll of recording paper 100 is further reduced to be detected with the first recording paper sensor 121 but no more detected with the second recording paper sensor 122 may be detected as a near-end state. In this state, the recording paper 100 is not detected with the third recording paper sensor 123.

Thus, according to this embodiment, as the roll of recording paper 100 gradually becomes smaller in radius, the center of the roll of recording paper 100 moves from the second region A2 to the first region A1. According to this embodiment, it is possible to determine changes in the condition of the roll of recording paper 100 becoming smaller in radius using the first through third recording paper sensors 121 through 123.

FIG. 27 illustrates the relationship between the presence or absence of detection of the recording paper 100 with the first through third recording paper sensors 121 through 123 and the condition of the recording paper 100. In FIG. 27, "1" indicates that the recording paper 100 is detected with the first, second or third recording paper sensor 121, 122 or 123, and "0" indicates that the recording paper 100 is not detected with the first, second or third recording paper sensor 121, 122 or 123.

Specifically, in the states depicted in FIGS. 20 through 22, that is, when the diameter of the roll of recording paper 100 is relatively large with the radius r1, r2 or r3, the combination of the presence or absence of detection of the recording paper 100 with the first recording paper sensor 121, the presence or absence of detection of the recording paper 100 with the second recording paper sensor 122, and the presence or absence of detection of the recording paper 100 with the third recording paper sensor 123 (hereinafter referred to as "the presence or absence of detection of the recording paper 100 with the first through third recording paper sensors 121 through 123") is (0, 1, 1).

Furthermore, in the states depicted in FIGS. 23 and 24, that is, when the recording paper 100 has a little smaller radius to have the radius r4 or r5 of a medium diameter, the presence or absence of detection of the recording paper 100 with the first through third recording paper sensors 121 through 123 is (0, 1, 0).

Furthermore, in the state depicted in FIG. 25, that is, when the roll of recording paper 100 is further reduced in radius to have the radius r6, the presence or absence of detection of the recording paper 100 with the first through third recording paper sensors 121 through 123 is (1, 1, 0). Therefore, the roll of recording paper 100 is not detected with the first recording paper sensor 121 before the radius becomes r6. Accordingly, the near-end state of the recording paper 100 is detected by the detection of the roll of recording paper 100 with the first recording paper sensor 121.

Instead of the state depicted in FIG. 25, namely, the state where the radius of the recording paper 100 is r6, the state depicted in FIG. 26, namely, the state where the radius of the recording paper 100 is r7 may be determined as the near-end state of the recording paper 100. In this case, in the state where the recording paper 100 has the radius r7, which is detected as the near-end state, the presence or absence of detection of the recording paper 100 with the first through third recording paper sensors 121 through 123 is (1, 0, 0).

Furthermore, when the presence or absence of detection of the recording paper 100 with the first through third recording paper sensors 121 through 123 is (0, 0, 1), it may be determined that the roll of recording paper 100 is rolling on the bottom surface 11*a* of the recording paper holder 11 (the recording paper 100 is rotating).

When the presence or absence of detection of the recording paper 100 with the first through third recording paper sensors 121 through 123 is (0, 0, 0), there is no recording paper 100 inside the recording paper holder 11.

Furthermore, in the case described above, the three recording paper sensors, that is, the first through third recording paper sensors 121 through 123, do not simultaneously detect the recording paper 100. Nor do the first and third recording paper sensors 121 and 123 simultaneously detect the recording paper 100. Accordingly, when the presence or absence of detection of the recording paper 100 with the first through third recording paper sensors 121 through 123 is (1, 0, 1) or (1, 1, 1), such detection indicates a state that is impossible according to this embodiment, and is determined to be invalid.

Printers and a method of detecting the near-end state of recording paper in a printer are described above based on the embodiments. The present invention, however, is not limited to the specifically disclosed embodiments, and variations and modifications may be made without departing from the scope of the present invention.

DESCRIPTION OF THE REFERENCE NUMERALS

10 printer body
11 recording paper holder
11*a* bottom surface
11*b* curved surface
11*c* interior side surface
12 control circuit board
13 motor
14 motor
15 lock lever
20 lid
21 open lever
30 thermal head
41 fixed blade
42 movable blade
50 platen roller
100 (roll of) recording paper
110 projection
121 first recording paper sensor
122 second recording paper sensor

The invention claimed is:

1. A printer, comprising:
a printer body that includes
a recording paper holder configured to accommodate a roll of recording paper, the recording paper holder including an interior bottom surface that faces toward a space inside the recording paper holder and is configured to contact the recording paper accommodated in the space; and
a projection provided on the interior bottom surface of the recording paper holder; and
a lid attached to the printer body to be opened and closed relative to the printer body.

2. The printer as claimed in claim 1, wherein
the recording paper holder includes a curved surface formed to be continuous with the interior bottom surface, and
the projection is provided between the curved surface and the lid.

3. The printer as claimed in claim 2, wherein the curved surface has a shape similar to a part of a surface shape of the roll of the recording paper.

4. The printer as claimed in claim 1, further comprising:
a recording head attached to one of the printer body and the lid; and
a platen roller attached to the other of the printer body and the lid.

5. The printer as claimed in claim 1, wherein the projection includes a first projection and a second projection formed closer to the lid than the first projection.

6. The printer as claimed in claim 1, further comprising:
a sensor provided between the lid and the projection and configured to detect presence or absence of the recording paper.

7. A printer, comprising:
a printer body that includes
a recording paper holder configured to accommodate a roll of recording paper; and
a projection provided on an interior bottom surface of the recording paper holder;
a lid attached to the printer body to be opened and closed relative to the printer body;
a first sensor provided between the lid and the projection and configured to detect presence or absence of the recording paper; and
at least one of a second sensor and a third sensor, the second sensor being provided on a line substantially vertical to the projection inside the recording paper holder and configured to detect the presence or absence of the recording paper, the third sensor being provided at a position more distant from the lid than the projection inside the recording paper holder and configured to detect the presence or absence of the recording paper.

8. The printer as claimed in claim 7, wherein the recording paper holder is configured to accommodate the recording paper so that the recording paper is in contact with the interior bottom surface of the recording paper holder.

9. A method of detecting a near-end state of recording paper rolled and accommodated inside a recording paper holder of a printer body of a printer, the method comprising:
detecting presence or absence of the recording paper with a first sensor provided between a lid and a projection, the lid being attached to the printer body to be opened and closed relative to the printer body, the projection being provided on an interior bottom surface of the recording paper holder;
detecting the presence or absence of the recording paper with a second sensor provided on a line substantially vertical to the projection inside the recording paper holder;
detecting the presence or absence of the recording paper with a third sensor provided at a position more distant from the lid than the projection inside the recording paper holder;
determining a state of the recording paper based on an output of the first sensor, an output of the second sensor, and an output of the third sensor; and
determining the near-end state of the recording paper in response to a change in the determined state of the recording paper.

10. The method as claimed in claim 9, wherein the near-end state of the recording paper is determined in response to the change in the determined state of the recording paper from a first state where the presence of the recording paper is detected with the second sensor and the absence of the recording paper is detected with each of the first sensor and the third sensor to a second state where the presence of the recording paper is detected with at least the first sensor and the absence of the recording paper is detected with at least the third sensor.

11. The method as claimed in claim 9, further comprising:
determining that the recording paper is newly loaded in the recording paper holder in response to detecting the presence of the recording paper with each of the second sensor and the third sensor and the absence of the recording paper with the first sensor.

* * * * *